US008245098B2

(12) United States Patent
Han et al.

(10) Patent No.: US 8,245,098 B2
(45) Date of Patent: Aug. 14, 2012

(54) SELECTIVELY STRENGTHENING AND WEAKENING CHECK-NODE MESSAGES IN ERROR-CORRECTION DECODERS

(75) Inventors: Yang Han, Santa Clara, CA (US); Kiran Gunnam, San Jose, CA (US); Shaohua Yang, San Jose, CA (US); Hao Zhong, Milpitas, CA (US); Nils Graef, Milpitas, CA (US); Yuan Xing Lee, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 504 days.

(21) Appl. No.: 12/538,915

(22) Filed: Aug. 11, 2009

(65) Prior Publication Data

US 2010/0042897 A1 Feb. 18, 2010

Related U.S. Application Data

(60) Provisional application No. 61/089,297, filed on Aug. 15, 2008.

(51) Int. Cl.
*H03M 13/00* (2006.01)
*G06F 11/10* (2006.01)

(52) U.S. Cl. .................................. 714/752; 714/780
(58) Field of Classification Search .............. 714/752, 714/755, 780
See application file for complete search history.

(56) References Cited

U.S. PATENT DOCUMENTS

| 6,307,901 B1 | 10/2001 | Yu et al. |
| 6,888,897 B1 | 5/2005 | Nazari et al. |
| 7,181,676 B2 | 2/2007 | Hocevar |
| 7,237,181 B2 * | 6/2007 | Richardson ............ 714/780 |
| 7,340,671 B2 | 3/2008 | Jones et al. |

(Continued)

FOREIGN PATENT DOCUMENTS

WO  WO03092170 A1  11/2003

(Continued)

OTHER PUBLICATIONS

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

(Continued)

*Primary Examiner* — James C Kerveros
(74) *Attorney, Agent, or Firm* — Mendelsohn, Drucker & Associates, P.C.; Craig M. Brown; Steve Mendelsohn

(57) ABSTRACT

In one embodiment, an LDPC decoder has a plurality of check-node units (CNUs) and a controller. Initially, the CNUs generate check-node messages based on an initial offset value selected by the controller. If the decoder converges on a trapping set, then the controller selects new offset values for missatisfied check nodes (MSCs), the locations of which are approximated, and/or unsatisfied check nodes (USCs). In particular, offset values are selected such that (i) the messages corresponding to the MSCs are decreased relative to the messages that would be generated using the initial offset value and/or (ii) the messages corresponding to the USCs are increased relative to the messages that would be generated using the initial offset value. Decoding is then continued for a specified number of iterations to break the trapping set. In other embodiments, the controller selects scaling factors rather than, or in addition to, offset values.

20 Claims, 5 Drawing Sheets

U.S. PATENT DOCUMENTS

| | | | |
|---|---|---|---|
| 7,739,558 B1* | 6/2010 | Farjadrad et al. | 714/704 |
| 7,752,523 B1 | 7/2010 | Chaichanavong et al. | |
| 7,805,642 B1* | 9/2010 | Farjadrad | 714/708 |
| 7,895,500 B2 | 2/2011 | Sun et al. | |
| 7,904,793 B2* | 3/2011 | Mokhlesi et al. | 714/780 |
| 7,941,737 B2 | 5/2011 | Gopalakrishnan et al. | |
| 8,010,869 B2 | 8/2011 | Wehn et al. | |
| 8,020,078 B2* | 9/2011 | Richardson | 714/780 |
| 8,046,658 B2 | 10/2011 | Heinrich et al. | |
| 8,127,209 B1* | 2/2012 | Zhang et al. | 714/780 |
| 8,151,171 B2 | 4/2012 | Blanksby | |
| 8,156,409 B2 | 4/2012 | Patapoutian et al. | |
| 2002/0062468 A1 | 5/2002 | Nagase et al. | |
| 2002/0166095 A1 | 11/2002 | Lavi et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0107181 A1 | 5/2006 | Dave et al. | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon et al. | |
| 2008/0163032 A1 | 7/2008 | Lastras-Montano | |
| 2008/0235561 A1 | 9/2008 | Yang | |
| 2008/0276156 A1 | 11/2008 | Gunnam et al. | |
| 2008/0301521 A1 | 12/2008 | Gunnam et al. | |
| 2009/0083609 A1 | 3/2009 | Yue et al. | |
| 2009/0150745 A1 | 6/2009 | Langner et al. | |
| 2009/0235146 A1 | 9/2009 | Tan et al. | |
| 2009/0273492 A1 | 11/2009 | Yang et al. | |
| 2009/0319860 A1 | 12/2009 | Sharon et al. | |
| 2010/0042806 A1 | 2/2010 | Gunnam | |
| 2010/0042890 A1 | 2/2010 | Gunnam | |
| 2010/0050043 A1 | 2/2010 | Savin | |

FOREIGN PATENT DOCUMENTS

| | | |
|---|---|---|
| WO | WO2004079563 A1 | 9/2004 |
| WO | WO2008004215 A2 | 1/2008 |
| WO | WO 2010/019168 A1 | 2/2010 |

OTHER PUBLICATIONS

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Sripimanwat, K., "Turbo Code Applications: A Journey From a Paper to Realization", Oct. 26, 2005, Springer, p. 27.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block- LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr.—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics", Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299, vol. 53, No. 8.

Kiran K. Gunnam, Gwan S. Choi, Mark B. Yeary and Mohammed Atiquzzaman—"VSLI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412, vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding", Proceedings of the 20th International Conference on VLSI Design, 6th International Conference: Embedded Systems, 2007, pp. 738-743.

R. Michael Tanner—"A Recursive Approach to Low Complexity Codes", IEEE transaction on Information Theory, Sep. 1981, pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, 7 Oct. 2002; pp. 99-104; XP002966498.

Alghonaim, E., et al., "Improving BER Performance of LDPC codes Based On Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

\* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix}$$

SELECTIVELY STRENGTHENING AND WEAKENING CHECK-NODE MESSAGES IN ERROR-CORRECTION DECODERS

CROSS-REFERENCE TO RELATED APPLICATIONS

This application claims the benefit of the filing date of U.S. provisional application No. 61/089,297, filed on Aug. 15, 2008 as, the teachings all of which are incorporated herein by reference in their entirety.

The subject matter of this application is related to U.S. patent application Ser. No. 12/113,729 filed May 1, 2008, U.S. patent application Ser. No. 12/113,755 filed May 1, 2008, U.S. patent application Ser. No. 12/323,626 filed Nov. 26, 2008, U.S. patent application Ser. No. 12/401,116 filed Mar. 10, 2009, PCT patent application no. PCT/US08/86523 filed Dec. 12, 2008, PCT patent application no. PCT/US08/86537 filed Dec. 12, 2008, PCT patent application no. PCT/US09/39918 filed Apr. 8, 2009, PCT application no. PCT/US09/39279 filed on Apr. 2, 2009, U.S. patent application Ser. No. 12/420,535 filed Apr. 8, 2009, U.S. patent application Ser. No. 12/475,786 filed Jun. 1, 2009, U.S. patent application Ser. No. 12/260,608 filed on Oct. 29, 2008, PCT patent application no. PCT/US09/41215 filed on Apr. 21, 2009, U.S. patent application Ser. No. 12/427,786 filed on Apr. 22, 2009, U.S. patent application Ser. No. 12/492,328 filed on Jun. 26, 2009, U.S. patent application Ser. No. 12/492,346 filed on Jun. 26, 2009, U.S. patent application Ser. No. 12/492,357 filed on Jun. 26, 2009, and U.S. patent application Ser. No. 12/492,374 filed on Jun. 26, 2009, the teachings of all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break the trapping sets and/or (ii) prevent the LDPC decoder from converging on trapping sets.

SUMMARY OF THE INVENTION

In one embodiment, the present invention is a method for recovering an error-correction (EC)-encoded codeword. For a current iteration, the method (a) receives a first set of input values and (b) generates a first check-node message based on the first set of input values and a first adjustment value. The first set of input values corresponds to the EC-encoded codeword, and each input value in the first set corresponds to a different bit of the EC-encoded codeword. Also, for the current iteration, the method (c) receives a second set of input values and (d) generates a second check-node message based on the second set of input values and a second adjustment value different from the first adjustment value. The second set of input values corresponds to the EC-encoded codeword, and each input value in the second set corresponds to a different bit of the EC-encoded codeword.

In another embodiment, the present invention is an apparatus for performing the method described above. The apparatus comprises an error-correction (EC) decoder for recovering the EC-encoded codeword. The EC decoder comprises at least first and second check-node units (CNUs). For a current iteration of the EC decoder, the first CNU receives the first set of input values and generates the first check-node message based on the first set of input values and the first adjustment value. Also, for the current iteration, the second CNU receives the second set of input values and generates the second check-node message based on the second set of input values and the second adjustment value, which is different from the first adjustment value.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check H-matrix that may be used to implement a regular, quasi-cyclic (QC) low-density parity-check (LDPC) code;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants (i.e., block rows) where j=1, . . . , r and c=10 columns of circulants (i.e., block columns) where k=1, . . . , c. A circulant is a sub-matrix that is either an identity matrix or is obtained by cyclically shifting an identity matrix, and a quasi-cyclic LDPC code is an LDPC code in which all of the sub-matrices are circulants. In H-matrix 100, each circulant $B_{j,k}$ is a p×p sub-matrix that may be obtained by cyclically shifting a single p×p identity matrix. For purposes of this discussion, assume that p=72 such that H-matrix 100 has p×r=72×4=288 total rows and p×c=72× 10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to $1 \times c = 1 \times 10 = 10$, and the total hamming weight $w_c$ for each column of H-matrix 100 is equal to $1 \times r = 1 \times 4 = 4$. Each of the 288 rows of H-matrix 100 corresponds to an $m^{th}$ check node, where m ranges from 0, ..., 287, and each of the 720 columns corresponds to an $n^{th}$ variable node (also referred to as a bit node), where n ranges from 0, ..., 719. Further, each check node is connected to $w_r=10$ variable nodes as indicated by the 1s in a row, and each variable node is connected to $w_c=4$ check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

Figure 2:
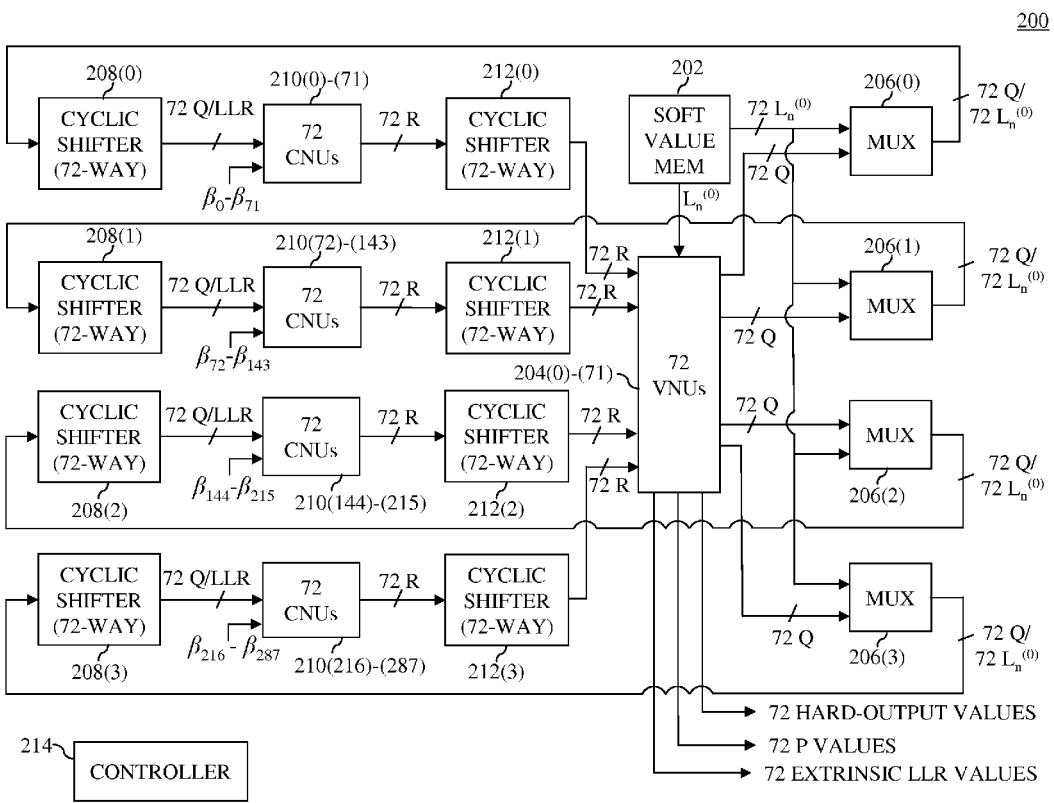
FIG. 2 shows a simplified block diagram of an LDPC decoder according to one embodiment of the present invention that may be used to recover codewords encoded using an H-matrix such as the H-matrix of FIG. 1.

FIG. 2 shows a simplified block diagram of an LDPC decoder 200 according to one embodiment of the present invention that may be used to decode codewords encoded using an H-matrix such as H-matrix 100 of FIG. 1. For each codeword received, LDPC decoder 200 receives 720 soft values (e.g., log-likelihood ratios (LLR)) $L_n^{(0)}$ from a channel detector such as a soft-output Viterbi detector and stores these soft values $L_n^{(0)}$ in soft-value memory 202. Each soft value $L_n^{(0)}$ corresponds to one bit of the codeword, and each codeword is decoded iteratively using a message-passing algorithm. For this discussion, suppose that each soft value $L_n^{(0)}$ has five bits, including one hard-decision bit and a four-bit confidence value.

In general, LDPC decoder 200 decodes the 720 soft values $L_n^{(0)}$ (i.e., messages) using a block-serial message-passing schedule. The messages are updated using (i) 288 check-node units (CNUs) 210, where each CNU 210 performs check-node updates for one row (i.e., the $m^{th}$ check node) of H-matrix 100 and (ii) 72 five-bit variable-node units (VNUs) 204, where each VNU 204 performs the variable-node updates for ten columns (i.e., the $n^{th}$ variable nodes) of H-matrix 100. CNUs 210(0), ..., 210(287) perform the check-node (i.e., row) updates for the 288 rows of H-matrix 100, one block column at a time, such that the check-node updates for the first block column (i.e., circulants $B_{1,1}$, $B_{2,1}$, $B_{3,1}$, and $B_{4,1}$) are performed, followed by the check-node updates for the second block column (i.e., circulants $B_{1,2}$, $B_{2,2}$, $B_{3,2}$, and $B_{4,2}$), followed by the check-node updates for the third block column (i.e., circulants $B_{1,3}$, $B_{2,3}$, $B_{3,3}$, and $B_{4,3}$), and so forth. VNUs 204(0), ..., 204(71) then perform the variable-node (i.e., column) updates for the 720 columns of H-matrix 100, one block column at a time, such that the variable-node updates for the first block column (i.e., circulants $B_{1,1}$, $B_{2,1}$, $B_{3,1}$, and $B_{4,1}$) are performed, followed by the variable-node updates for the second block column (i.e., circulants $B_{1,2}$, $B_{2,2}$, $B_{3,2}$, and $B_{4,2}$), followed by the variable-node updates for the third block column (i.e., circulants $B_{1,3}$, $B_{2,3}$, $B_{3,3}$, and $B_{4,3}$), and so forth. An iteration of LDPC decoder 200 (i.e., a local iteration) is complete after all check-node updates and variable-node updates have been performed (i.e., one pass through LDPC decoder 200 has been performed).

Initially, the 720 five-bit soft values $L_n^{(0)}$ are provided to four multiplexers 206(0), ..., 206(3) at a rate of 72 soft values $L_n^{(0)}$ per clock cycle such that each multiplexer 206 receives all 72 soft values $L_n^{(0)}$ in the set. Each multiplexer 206 also receives 72 five-bit variable-node messages (herein referred to as Q messages) from VNUs 204(0), ..., 204(71), which are generated as discussed in further detail below. During the first iteration of LDPC decoder 200, multiplexers 206(0), ..., 206(3) select the sets of 72 five-bit soft values $L_n^{(0)}$ that they receive to output to 72-way cyclic shifters 208(0), ..., 208(3), respectively. The initial Q messages, which are not selected, may be Q messages generated for a previously considered codeword. During subsequent iterations of LDPC decoder 200, multiplexers 206(0), ..., 206(3) select the sets of 72 five-bit Q messages that they receive from VNUs 204(0), ..., 204(71) to output to 72-way cyclic shifters 208(0), ..., 208(3), respectively. For the following discussion, it will be understood that any reference to Q messages applies to soft values $L_n^{(0)}$ during the first iteration of LDPC decoder 200.

Cyclic shifters 208(0), ..., 208(3) cyclically shift the sets of 72 five-bit Q messages that they receive based on a cyclic-shift signal that may be received from, for example, controller 214. The cyclic-shift signal corresponds to cyclic-shift factors of the circulants of H-matrix 100 of FIG. 1. For example, during the first clock cycle of an iteration of LDPC decoder 200, cyclic shifters 208(0), ..., 208(3) may shift their respective sets of 72 five-bit Q messages based on the shift factors of circulants $B_{1,1}$, $B_{2,1}$, $B_{3,1}$, and $B_{4,1}$ of H-matrix 100 of FIG. 1, respectively. During the second clock cycle of an iteration of LDPC decoder 200, cyclic shifters 208(0), ..., 208(3) shift their respective sets of 72 five-bit Q messages based on the shift factors of circulants $B_{1,2}$, $B_{2,2}$, $B_{3,2}$, and $B_{4,2}$, respectively. Cyclic shifters 208(0), ..., 208(3) then provide their respective 72 cyclically shifted five-bit Q messages to CNUs 210(0), ..., 210(287), such that each CNU 210 receives a different one of the Q messages.

Each CNU 210(i) receives a number of five-bit Q messages equal to the hamming weight $w_r$ of a row of H-matrix 100 (e.g., 10) at a rate of one Q message per clock cycle and (ii) generates $w_r$ five-bit check-node messages (herein referred to as R messages). Each R message may be generated using a suitable check-node algorithm, such as the offset min-sum algorithm, characterized by Equations (1), (2), and (3) shown below:

$$R_{mn}^{(i)} = \delta_{mn}^{(i)} \max(\kappa_{mn}^{(i)} - \beta_m, 0) \quad (1)$$

$$\kappa_{mn}^{(i)} = |R_{mn}^{(i)}| = \min_{n' \in N(m)/n} |Q_{n'm}^{(i-1)}| \quad (2)$$

$$\delta_{mn}^{(i)} = \left( \prod_{n' \in N(m)/n} \text{sign}(Q_{n'm}^{(i-1)}) \right), \quad (3)$$

where (i) $R_{nm}^{(i)}$ represents the R message corresponding to $m^{th}$ check node (i.e., row) and the $n^{th}$ variable node (i.e., column) of H-matrix 100 of FIG. 1 for the $i^{th}$ iteration of LDPC decoder 200, (ii) $Q_{nm}^{(i-1)}$ represents the Q message corresponding to the $n^{th}$ variable node and the $m^{th}$ check node of H-matrix 100 for the $(i-1)^{th}$ iteration, (iii) $\beta_m$ represents an offset value for the $m^{th}$ check node, that may be selected as described below, and (iv) the function sign indicates that the multiplication operation (i.e., $\Pi$) is performed on the signs of the $Q_{nm}^{(i-1)}$ messages. Suppose that n' is a variable node in the set N(m)/n of all variable nodes connected to the $m^{th}$ check node except for the $n^{th}$ variable node (i.e., n'∈N(m)/n). The CNU 210 corresponding to the $m^{th}$ check node (i.e., row) generates message $R_{nm}^{(i)}$ based on all Q messages received during the previous $(i-1)^{th}$ iteration from the set N(m)/n. Thus, in the embodiment of FIG. 2, each R message is generated based on $N(m)/n=$nine Q messages (i.e., $w_r-1=10-1$). Note that, for the first iteration, soft values $L_n^{(0)}$ received from soft-value memory 202 are used in Equations (2) and (3) in lieu of the Q messages for the prior iteration (i.e., $Q_{n'm}^{(0)} = L_{n'm}^{(0)}$).

The particular offset value $\beta_m$ used by each CNU 210 may be selected, for example, by controller 214. Controller 214 may select offset values $\beta_0$ to $\beta_{287}$ such that all 288 offset values are equal to one another, or controller 214 may select offset values $\beta_0$ to $\beta_{287}$ such that the 288 offset values have anywhere from 2 to 288 different values. For this discussion, suppose that upon startup controller 214 sets offset values $\beta_0$ to $\beta_{287}$ equal to an initial offset value $\beta_m^{(0)}$ (e.g., 0), that may be determined experimentally and that may vary based on code parameters. As discussed below, if after a specified number of iterations, LDPC decoder 200 encounters a trapping set, then the offset values $\beta_m$ may be modified in an attempt to overcome the trapping set.

Figure 3:
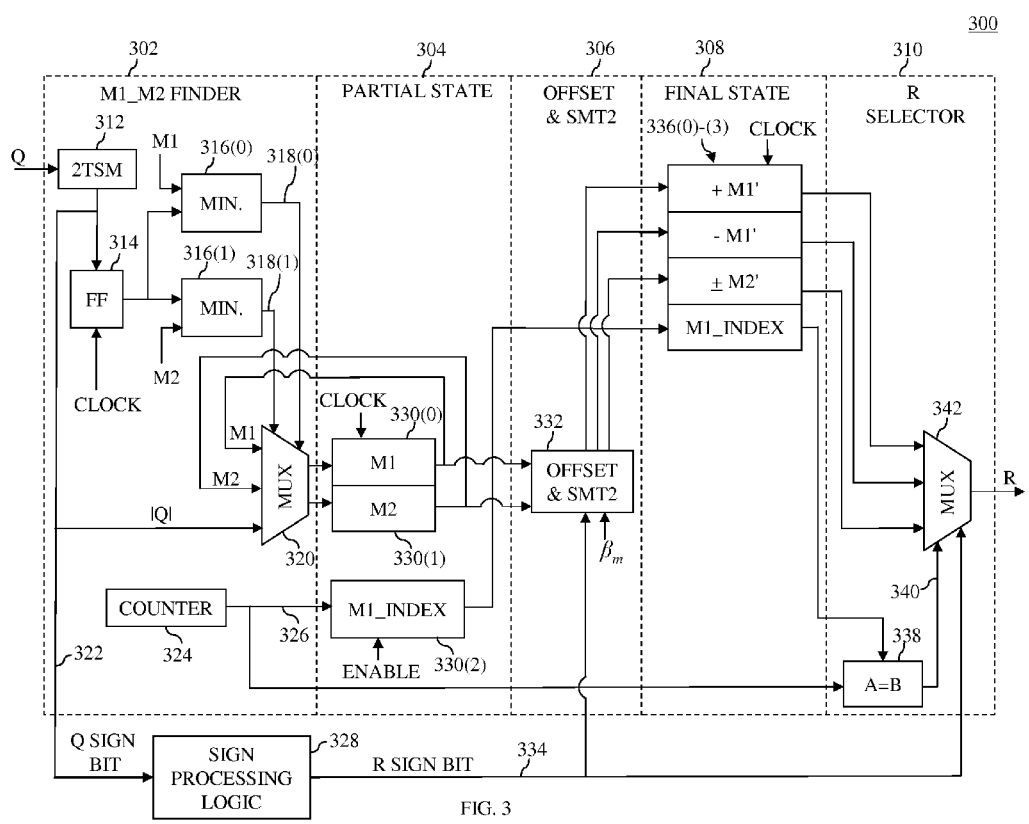
FIG. 3 shows a simplified block diagram of a check-node unit (CNU) according to one embodiment of the present invention that may be used to implement each CNU of the LDPC decoder of FIG. 2.

FIG. 3 shows a simplified block diagram of a CNU 300 according to one embodiment of the present invention that may be used to implement each CNU 210 of LDPC decoder 200 of FIG. 2. In general, CNU 300 generates ten five-bit R messages, where each five-bit R message is generated using a set N(m)/n of nine Q messages (one message is excluded as described above). For nine of these ten five-bit R messages, the minimum (i.e., smallest) magnitude of the Q messages generated using Equation (2) is the same. For one of these R messages, the smallest magnitude of the Q messages will be the second-smallest magnitude of the Q messages because the smallest magnitude of the Q messages will be excluded from the calculation as described above. Rather than performing Equation (2) ten times, once for each of the ten five-bit R messages, CNU 300 implements a value-reuse technique, wherein CNU 300 (i) determines the Q messages with the smallest and second-smallest magnitudes using M1_M2 finder 302 and (ii) generates the ten five-bit R messages based on the smallest and second-smallest magnitudes.

During each of the first ten clock cycles, M1_M2 finder 302 receives a five-bit Q message in two's-complement format. M1_M2 finder 302 converts each five-bit Q message from two's-complement format to a five-bit sign-magnitude value using two's-complement-to-sign-magnitude (2TSM) converter 312. The sign bit 322 of the sign-magnitude value is provided to sign processing logic 328, which (i) generates a product of the sign bits 322 of all ten Q messages and (ii) multiplies each of the sign bits 322 by the product to generate a different sign bit (i.e., an R sign bit 334) for each of the ten R messages. The four-bit magnitude |Q|[3:0] of the five-bit sign-magnitude value Q[4:0] is provided to multiplexer (MUX) 320 along with the four-bit smallest magnitude value M1 and the four-bit second-smallest magnitude value M2 stored in partial state registers 330(0) and 330(1) of partial state memory 304, respectively. In addition, the four-bit magnitude value |Q|[3:0] is provided to flip-flop (FF) 314, which synchronizes the timing of CNU 300 with the clock signal of LDPC decoder 200.

Minimum operator 316(0) compares the magnitude value |Q| to smallest magnitude value M1 stored in register 330(0). If the magnitude value |Q| is smaller than smallest magnitude value M1, then minimum operator 316(0) asserts control signal 318(0) (i.e., sets 318(0) equal to 1). Otherwise, minimum operator 316(0) de-asserts control signal 318(0) (i.e., sets 318(0) equal to 0). Similarly, minimum operator 316(1) compares the magnitude value |Q| to second-smallest magnitude value M2 stored in register 330(1). If the magnitude value |Q| is smaller than M2, then control signal 318(1) is asserted. Otherwise, control signal 318(1) is de-asserted. To further understand the operation of MUX 320, consider the logic table of Table I for magnitude value |Q|.

TABLE I

| Multiplexer 320 Logic Table | | | |
|---|---|---|---|
| Control Signal 318(0) | Control Signal 318(1) | Output to 330(0) | Output to 330(1) |
| 0 (|Q| ≧ M1) | 0 (|Q| ≧ M2) | M1 | M2 |
| 0 (|Q| ≧ M1) | 1 (|Q| < M2) | M1 | |Q| |
| 1 (|Q| < M1) | 0 (|Q| ≧ M2) | N/A | N/A |
| 1 (|Q| < M1) | 1 (|Q| < M2) | |Q| | M1 |

Table I shows that, if control signals 318(0) and 318(1) are both de-asserted (i.e., |Q|≧M1 and M2), then magnitude value |Q| is discarded, and the previously stored smallest and second-smallest magnitude values M1 and M2 are retained in M1 register 330(0) and M2 register 330(1), respectively. If control signal 318(0) is de-asserted and control signal 318(1) is asserted (i.e., M2≧|Q|≧M1), then (i) smallest magnitude value M1 is retained in M1 register 330(0), (ii) magnitude value |Q| is stored in M2 register 330(1), and (iii) previously stored second-smallest magnitude value M2 is discarded. If control signals 318(0) and 318(1) are both asserted (i.e., |Q|≦M1 and M2), then (i) magnitude value |Q| is stored in M1 register 330(0), (ii) the previously stored smallest value M1 is stored in M2 register 330(1), and (iii) the second-smallest value M2 is discarded. In addition to storing magnitude value |Q| in M1 register 330(0), M1_index register 330(2) is enabled, counter value 326 (generated by counter 324) corresponding to the new smallest value M1 is stored in M1_index register 330(2), and the counter value previously stored in M1_index register 330(2) is discarded. Note that it is not possible that control signal 318(0) will be asserted and control signal 318(1) will be de-asserted because this would indicate that the magnitude value |Q| is smaller than smallest magnitude value M1 but larger than second-smallest magnitude value M2. Also, before the first clock cycle, the smallest and second-smallest magnitude values M1 and M2 are initialized to suitably large values (e.g., binary 1111), and M1_index is initialized to 0.

After all ten Q messages have been considered, processing logic 332 of offset-and-sign-magnitude-to-two's-complement (SMT2) processor 306 offsets four-bit smallest magnitude value M1 and four-bit second-smallest magnitude value M2 by offset value $\beta_m$ as shown in Equation (1) to generate four-bit offset smallest magnitude value M1' and four-bit offset second-smallest magnitude value M2'. Processing logic 332 converts four-bit offset smallest magnitude value M1' into two's-complement format and appends a positive sign bit to generate a five-bit positive value (+M1'), which is subsequently stored in register 336(0) of final-state processor 308. Processing logic 332 also converts four-bit offset smallest magnitude value M1' into two's-complement format and appends a negative sign bit to generate a five-bit negative value (−M1'), which is subsequently stored in register 336(1). In addition, if R sign bit 334 from sign processing logic 328 is a positive sign bit (0), then processing logic 332 converts four-bit offset second-smallest magnitude value M2' into a five-bit positive two's-complement value (+M2') for storage in register 336(2). If R sign bit 334 from sign processing logic 328 is a negative sign bit (1), then processing logic 332 converts four-bit offset second-smallest magnitude value M2' into a five-bit negative two's-complement value (−M2') for storage in register 336(2). Register 336(3) of final-state processor 308 stores the counter value M1_INDEX from M1_index register 330(2).

During each of the next ten clock cycles, MUX 342 of R selector 310 outputs a five-bit R message based on (1) the positive value (+M1'), (2) the negative value (-M1'), (3) the positive or negative value (±M2'), (4) a comparison bit 340 from comparison operator 338, and (5) the corresponding sign bit 334 stored in sign processing logic 328. Each comparison bit 340 is generated by comparing current counter value 326 to the M1_index value stored in register 336(3). When the two are equal, comparison bit 340 is asserted, and when the two are not equal, comparison bit 340 is de-asserted. Each sign bit 334 may be generated as $\delta_{mn}^{(i)}$ using Equation (3), or alternatively, in the event that sign processing logic 328 is implemented using a FIFO, by multiplying a stored sign bit 322, as it is output from the FIFO, by the product of all sign bits 322 stored in sign processing logic 328. To further understand how R messages are output from MUX 342, consider the logic table of Table II.

TABLE II

Multiplexer 342 Logic Table

| Comparison Bit 340 | Sign Bit 334 | Output |
|---|---|---|
| 0 (A ≠ B) | 0 | +M1' |
| 0 (A ≠ B) | 1 | −M1' |
| 1 (A = B) | 0 | +M2' |
| 1 (A = B) | 1 | −M2' |

Table II shows that, if both comparison bit 340 and sign bit 334 are de-asserted, then the positive value (+M1') stored in register 336(0) will be output as the five-bit R message. If comparison bit 340 is de-asserted and sign bit 334 is asserted, then the negative value (−M1') stored in register 336(1) will be output as the five-bit R message. If comparison bit 340 is asserted and sign bit 334 is de-asserted, then the positive value (+M2') will have been stored in register 336(2) and will now be output as the five-bit R message. If both comparison bit 340 and sign bit 334 are asserted, then the negative value (−M2') will have been stored in register 336(3) and will now be output as the five-bit R message.

Referring back to FIG. 2, cyclic shifters 212(0), . . . , 212(3) receive sets of 72 five-bit R messages from their respective CNUs 210 and cyclically shift the sets of 72 five-bit R messages according to the cyclic shifts of the circulants $B_{j,k}$ of H-matrix 100 of FIG. 1. Essentially, cyclic shifters 212(0), . . . , 212(3) reverse the cyclic shifting of cyclic shifters 208(0), . . . , 208(3). For example, if cyclic shifters 208(0), . . . , 208(3) perform cyclic upshifting, then cyclic shifters 212(0), . . . , 212(3) may perform cyclic downshifting.

Cyclic shifters 212(0), . . . , 212(3) provide 4×72 cyclically shifted five-bit R messages to VNUs 204(0), . . . , 204(71), such that each VNU 204 receives four of the R messages, one from each cyclic shifter 212. Each VNU 204 updates each of the four five-bit Q messages that it generates as shown in Equation (4):

$$Q_{nm}^{(i)} = L_n^{(0)} + \sum_{m' \in M(n)/m} R_{m'n}^{(i-1)}, \quad (4)$$

where m' is a check node in the set M(n)/m of all check nodes connected to the $n^{th}$ variable node except the $m^{th}$ check node (i.e., m'∈M(n)/m). The $n^{th}$ variable node generates message $Q_{nm}^{(i)}$ based on (i) all R messages received during the previous $(i-1)^{th}$ iteration from the set M(n)/m and (ii) an initial soft value $L_n^{(0)}$ received from soft value memory 202 that corresponds to the $n^{th}$ variable node. Each VNU 204, which may be implemented using adder circuits, outputs the four updated five-bit Q messages that it generates, such that a different one of the four messages is provided to a different corresponding MUX 206.

In addition to outputting four updated five-bit Q messages, each VNU 204 outputs (i) a seven-bit extrinsic LLR value, (ii) a hard-decision output bit, and (iii) an eight-bit P value. Each seven-bit extrinsic LLR value may be represented as shown in Equation (5):

$$\text{Extrinsic Value}_n = \sum_{m \in M(n)} R_{mn}^{(i)}, \quad (5)$$

where m is a check node in the set M(n) of all check nodes connected to the $n^{th}$ variable node (i.e., m∈M(n)). Each eight-bit P value may be generated using Equation (6) as follows:

$$P_n = L_n^{(0)} + \sum_{m \in M(n)} R_{mn}^{(i)}, \text{ and} \quad (6)$$

each hard-decision bit $\hat{x}_n$ may be generated based on Equations (7) and (8) below:

$$\hat{x}_n = 0 \text{ if } P_n \geq 0 \quad (7)$$

$$\hat{x}_n = 1 \text{ if } P_n \leq 0. \quad (8)$$

$P_n$ is determined for each variable node by adding the extrinsic value from Equation (5) to the initial soft value $L_n^{(0)}$ received from soft-value memory 202 that corresponds to the $n^{th}$ variable node. If $P_n$ is greater than or equal to zero, then the hard-decision bit $\hat{x}_n$ is equal to zero, as shown in Equation (7). If $P_n$ is less than zero, then the hard-decision bit $\hat{x}_n$ is equal to one, as shown in Equation (8).

A parity check is then performed by, for example, a syndrome check calculator, using the hard-decision bits $\hat{x}_n$ to determine whether LDPC decoder 200 has possibly converged on a valid codeword. In particular, a 720-element vector $\hat{x}$ formed from 720 hard-decision bits $\hat{x}_n$ output from VNUs 204(0), . . . , 204(71) during ten clock cycles is multiplied by the transpose $H^T$ of H-matrix 100 of FIG. 1 assuming binary summation to generate a 288-bit vector (i.e., syndrome), where each bit of the 288-bit syndrome corresponds to one of the 288 check nodes (i.e., rows) of H-matrix 100. If one or more elements of the resulting 288-bit syndrome is equal to one (i.e., $\hat{x}H^T \neq 0$), then LDPC decoder 200 has not converged on a valid codeword. Each element of the 288-bit syndrome that has a value of one is considered an unsatisfied check node, and each element of the 288-bit syndrome that has a value of zero is either (i) a satisfied check node or (ii) a missatisfied check node (i.e., a check node that falsely shows as satisfied).

If each element of the resulting 288-bit vector is equal to zero (i.e., $\hat{x}H^T = 0$), then LDPC decoder 200 has converged on a valid codeword and a cyclic-redundancy check (CRC) may be performed by, for example, controller 214 to determine whether the valid codeword is the correct codeword (i.e., the codeword that was transmitted). When a CRC is performed, typically a number r of CRC bits are appended to the user data at the transmitter before LDPC encoding such that, upon decoding, the 720-element vector $\hat{x}$ output from VNUs 204(0), . . . , 204(71) comprises (i) the user data transmitted by the transmitter and (ii) the r CRC bits. To perform the CRC, the user data may be divided by a keyword that is known a priori by the receiver and the remainder of the division process may be compared to the r CRC bits. If the remainder is equal to the r CRC bits, then LDPC decoder 200 has converged on the correct codeword. If the remainder is not equal to the r CRC bits, then LDPC decoder 200 has not converged on the correct codeword.

If, after a predetermined number of iterations, LDPC decoder 200 does not converge on the correct codeword, then controller 214 may (i) check for the number of unsatisfied check nodes and (ii) compare the number of unsatisfied check nodes to a specified threshold value (e.g., 16). The specified threshold value, which may be determined experimentally, may be used to predict whether LDPC decoder 200 has (i) converged on a trapping set or (ii) experienced an error in the communication channel that does not correspond to convergence on a trapping set. If the number of unsatisfied check nodes is greater than or equal to the specified threshold value, then it is likely that LDPC decoder 200 has experienced an error in the communication channel. Such errors may result from, for example, a flaw on the platter of a hard-disk drive or excessive noise in the communication channel. When such errors occur, further action, such as retransmission of the data, may be needed to recover the correct codeword. In some cases, LDPC decoder 200 might not be capable of recovering the correct codeword.

If the number of unsatisfied check nodes is less than the specified threshold value, then it is likely that LDPC decoder 200 has converged on a trapping set. A trapping set, which may be defined as a set of w variable nodes that converges on a syndrome having a set of v odd-degree check nodes (i.e., unsatisfied check nodes) and an arbitrary number of even-degree check nodes (i.e., satisfied and/or missatisfied check nodes), may be caused by the passing of incorrect information between the check nodes and variable nodes. To further understand how a trapping set may result from the passing of incorrect information, consider FIG. 4.

Figure 4:
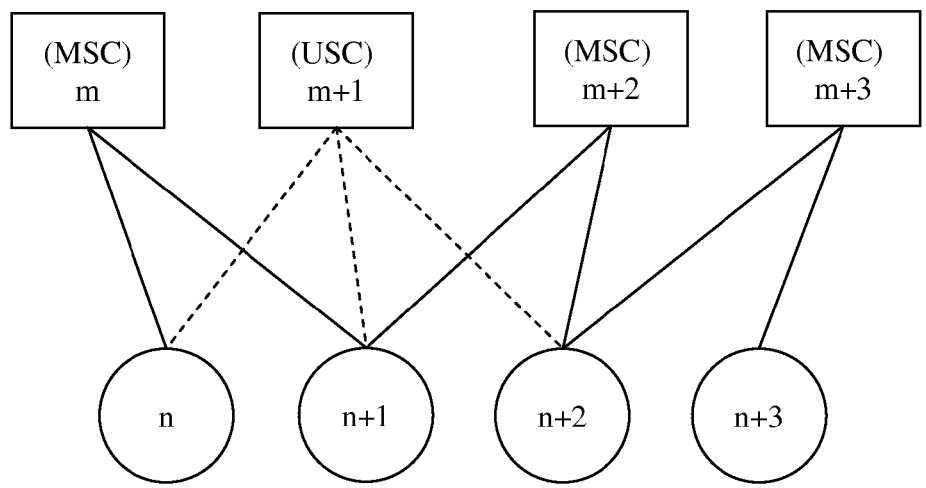
FIG. 4 shows an exemplary sub-graph of a Tanner graph of an LDPC code.

FIG. 4 shows an exemplary sub-graph 400 of a Tanner graph of an LDPC code. Sub-graph 400 has four check nodes m, . . . , (m+3) and four variable nodes n, . . . , (n+3). The full Tanner graph, which is not shown, may have additional check nodes and/or variable nodes, and the arrangement of the check nodes and/or variable nodes may vary from one LDPC code to the next. Suppose that check node (m+1) is an unsatisfied check node (USC) and that check nodes m, (m+2), and (m+3) are missatisfied check nodes (MSCs). In theory, unsatisfied check node (m+1) passes correct information (shown in dashed lines) to variable nodes n, (n+1), and (n+2) by correctly indicating that there is something wrong with the hard-decision bits of one or more of variable nodes n, (n+1), and (n+2) (i.e., that one or more of the hard-decision bits should be changed). Missatisfied check nodes m, (m+2), and (m+3), on the other hand, pass incorrect information (shown in solid lines) to variable nodes n, . . . , (n+3) by incorrectly indicating that the hard-decision bits of the neighboring variable nodes n, . . . , (n+3) are correct when in fact they are incorrect (i.e., the information is incorrect because it implies that the hard-decision bits of the variable nodes connected to the missatisfied check nodes should remain unchanged).

Typically, when a trapping set is encountered, the messages from missatisfied check nodes m, (m+2), and (m+3) override the messages from unsatisfied check node (m+1). For example, suppose that variable node (n+1) receives (i) one message from unsatisfied check node (m+1) indicating that the hard-decision bit of variable node (n+1) is incorrect and (ii) two messages from missatisfied check nodes m and (m+2) indicating that the hard-decision bit of variable node (n+1) is correct. In updating the hard-decision bit of variable node (n+1), the three messages are added together along with the initial soft-value as shown in Equation (6).

If the confidence values of the messages from missatisfied check nodes m and (m+2) together are greater than the confidence value of the message from unsatisfied check node (m+1), then the missatisfied check-node messages may steer variable node (n+1) toward an incorrect hard-decision bit (represented as shown in Equations (7) and (8)). As subsequent iterations are performed, and as the confidence values of the messages from missatisfied check nodes m and (m+2) together increase over the confidence value of the message from unsatisfied check node (m+1), the decoder may become trapped, making it difficult to recover the correct hard-decision bit for variable node (n+1). Typically, when the decoder converges on a trapping set after several iterations, the incorrect messages from the missatisfied check nodes are already relatively strong (i.e., have relatively large confidence values).

If, on the other hand, the confidence values of the messages from missatisfied check nodes m and (m+2) together are less than the confidence value of the message from unsatisfied check node (m+1), then the unsatisfied check-node message may steer the decoder away from the trapping set, thereby enabling the decoder to recover the correct hard-decision bit for variable node (n+1).

In theory, after a trapping set has been encountered, the confidence values of the check-node messages may be adjusted to break the trapping set. The confidence values of the check-node messages may be adjusted by, for example, adjusting offset values $\beta_m$ from the initial offset value $\beta_m^{(0)}$. Breaking trapping sets can be efficiently achieved by (i) changing offset values $\beta_m$ relative to the initial offset $\beta_m^{(0)}$ to increase the confidence values of messages corresponding to unsatisfied check nodes (i.e., strengthening the unsatisfied check-node messages) such that the unsatisfied check-node messages override the missatisfied check-node messages and/or (ii) changing offset values $\beta_m$ relative to the initial offset $\beta_m^{(0)}$ to decrease confidence values of messages corresponding to missatisfied check-node messages (i.e., weakening the unsatisfied check-node messages) such that the unsatisfied check-node messages override the missatisfied check-node messages.

In practice, it is relatively easy to identify the locations of unsatisfied check nodes, but it may be relatively difficult, if not impossible, to identify the locations of missatisfied check nodes with certainty. The locations of the unsatisfied check nodes may be identified by looking at the location of the ones in the syndrome. The locations of the missatisfied check nodes, on the other hand, typically cannot be identified by looking at the syndrome because missatisfied check nodes falsely appear as being satisfied (i.e., having a value of zero). Since any check node corresponding to a syndrome value of zero is a possible missatisfied check node, the decoder could treat all such check nodes (i.e., all satisfied and missatisfied check nodes) alike by weakening the messages from all satisfied and missatisfied check nodes. However, weakening the messages from all satisfied and missatisfied check nodes might not be preferable because this would involve weakening messages that are correct (i.e., the check node messages corresponding to the satisfied check nodes).

As an alternative, the decoder could attempt to approximate the locations of the missatisfied check nodes to minimize or prevent weakening of satisfied check nodes. For example, suppose that, after the specified number of iterations, LDPC decoder 200 converges on a set $C_{USC}$ of unsatisfied check nodes (e.g., node (m+1)∈ $C_{USC}$ in FIG. 4), and suppose that the unsatisfied check nodes in set $C_{USC}$ are connected to a set $V_{USC}$ of variable nodes (e.g., n, (n+1), and (n+2)∈ $V_{USC}$ in FIG. 4). The set $C_{MSC}$ of missatisfied check nodes could comprise any check node in the set $C_{VUSC}$ of check nodes (e.g., m, (m+1), (m+2), (m+3)∈$C_{VUSC}$ in FIG. 4) connected to the variable nodes in set $V_{USC}$ excluding the set $C_{USC}$ of check nodes (e.g., m, (m+2), (m+3)∈ $C_{VUSC}/C_{USC}$ in FIG. 4).

Once the set $C_{USC}$ of unsatisfied check nodes and the approximated set $C_{VUSC}/C_{USC}$ of missatisfied check nodes are ascertained, the messages corresponding to the check nodes in the set $C_{USC}$ of unsatisfied check nodes may be strengthened and the messages corresponding to the check nodes in the approximated set $C_{VUSC}/C_{USC}$ of missatisfied check nodes may be weakened.

To strengthen the check-node messages generated for the set $C_{USC}$ of unsatisfied check nodes, the offset values $\beta_m$ corresponding to each unsatisfied check node in the set $C_{USC}$ may be increased or decreased relative to the initial offset value $\beta_m^{(0)}$ depending on whether the LDPC decoder performs offsetting using addition or subtraction. For example, if the decoder subtracts offset values $\beta_m$ as shown in Equation (1), then decreasing the offset values $\beta_m$ relative to initial offset value $\beta_m^{(0)}$ increases the confidence values of the check-node messages. If, on the other hand, the decoder adds offset values $\beta_m$, then increasing the offset values $\beta_m$ relative to initial offset value $\beta_m^{(0)}$ increases the confidence values of the check-node messages.

To weaken the check-node messages generated for the approximated set $C_{VUSC}/C_{USC}$ of missatisfied check nodes, the offset values $\beta_m$ corresponding to each check node in the approximated set $C_{VUSC}/C_{USC}$ may also be increased or decreased relative to the initial offset value $\beta_m^{(0)}$ depending on whether the LDPC decoder performs offsetting using addition or subtraction. For example, if the decoder subtracts offset values $\beta_m$ as shown in Equation (1), then increasing the offset values $\beta_m$ relative to initial offset value $\beta_m^{(0)}$ decreases the confidence values of the check-node messages. If on the other hand, the decoder adds offset values $\beta_m$, then decreasing the offset values $\beta_m$ relative to initial offset value $\beta_m^{(0)}$ decreases the confidence values of the check-node messages.

The particular offset values $\beta_m$ applied for the set $C_{USC}$ of unsatisfied check nodes and/or the particular offset values $\beta_m$ applied for the approximated set $C_{VUSC}/C_{USC}$ of check nodes may be selected by, for example, controller 214. Note that the offset values $\beta_m$ do not need to be the same for all check nodes in the set $C_{USC}$ or for all check nodes in the approximated set $C_{VUSC}/C_{USC}$. These values should preferably be selected such that the correct messages from the unsatisfied check nodes sufficiently disturb the incorrect messages from the missatisfied check nodes.

By selectively strengthening unsatisfied check nodes and/or selectively weakening missatisfied check nodes to break trapping sets, the present invention may improve error-floor characteristics of LDPC codes. The present invention may be implemented in existing LDPC decoder structures with little or no hardware modifications or may be implemented in new LDPC decoder structures.

Figure 5:
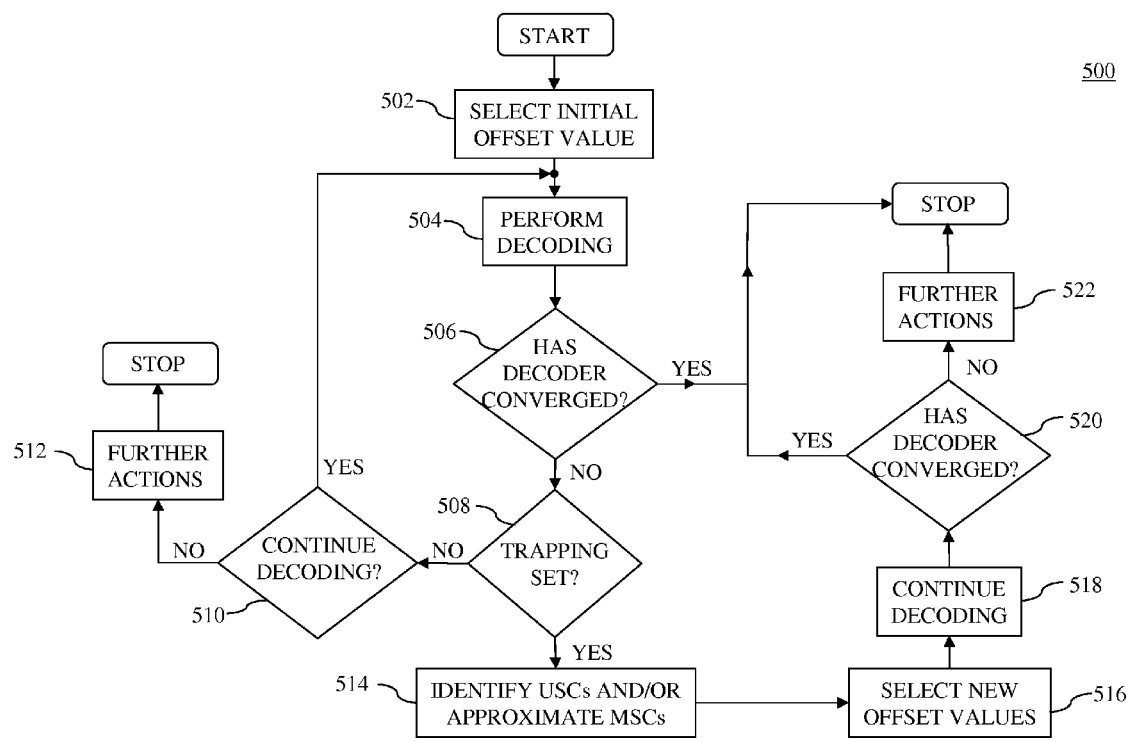
FIG. 5 shows a simplified flow diagram of processing implemented by a controller, such as the controller of FIG. 2, according to one embodiment of the present invention.

FIG. 5 shows a simplified flow diagram 500 of processing implemented by a controller, such as controller 214 of FIG. 2, according to one embodiment of the present invention. Upon startup, the controller selects initial offset value $\beta_m^{(0)}$ (step 502) and performs decoding using the initial offset value $\beta_m^{(0)}$ for all check-node messages (step 504). The controller then performs decision 506 to determine whether the decoder has converged on a valid codeword by, for example, performing a syndrome check as described above. If the decoder has converged on a valid codeword, then the decoder stops decoding. If the decoder has not converged on a valid codeword, then the controller determines whether a trapping set has been encountered (decision 508).

Determining whether the decoder has encountered a trapping may be performed using any suitable method. For example, as described above, the controller may compare the number of unsatisfied check nodes after a specified number of iterations of the decoder to a specified threshold value. If the number of unsatisfied check nodes is greater than or equal to the specified threshold value, then it is likely that LDPC decoder 200 has experienced an error in the communication channel. If the number of unsatisfied check nodes is less than the specified threshold value, then it is likely that LDPC decoder 200 has converged on a trapping set. As another example, the decoder could track the number of unsatisfied check nodes over several iterations. If, over several iterations, the number of unsatisfied check nodes is relatively stable, then this could be indicative of a trapping set. This method may be implemented by tracking the variance of the number of unsatisfied check nodes over several iterations. If the variance is less than a specified threshold value, then the LDPC decoder may suppose that a trapping set has been encountered. This later example may be advantageous when the decoder converges on a trapping set before the specified number of iterations. By identifying a trapping set before the specified number of iterations, the decoder can avoid performing unnecessary iterations. As yet another example, the decoder could determine whether (i) the vector resulting from $\hat{x}H^T$ possess a number ($b_{observed}$) of unsatisfied check nodes that is greater than zero and less than a pre-defined threshold $b_{max}$ (e.g., 16) and (ii) the particular configuration of unsatisfied check nodes has remained relatively stable (i.e., the number and locations of the unsatisfied check nodes has not changed) for several iterations of the LDPC decoder (e.g., two or three iterations). As yet still another example, the decoder could determine whether (i) the vector resulting from $\hat{x}H^T$ possess a number ($b_{observed}$) of unsatisfied check nodes greater than zero and less than a pre-defined threshold $b_{max}$ (e.g., 16), and (ii) the particular configuration of unsatisfied check nodes has remained relatively stable (i.e., unchanged) for several global iterations (e.g., two global iterations).

If the controller determines in decision 508 that the decoder has not converged on a trapping set, then the decoder may determine whether or not to continue decoding (decision 510). For example, if the number of unsatisfied check nodes is relatively large (e.g., greater than 16), then, as described above, the decoder might have experienced an error in the communication channel. In such a case, it might not be possible for the decoder to recover the correct codeword, and the controller might initiate further actions (step 512) such as request a retransmission of the data. If the decoder determines in decision 510 to continue decoding, then processing returns to step 504 for more decoding.

If the controller determines in decision 508 that the decoder has converged on a trapping set, then, in step 514, the controller (i) identifies the locations of the unsatisfied check nodes and/or (ii) approximates the locations of the missatisfied check nodes using, for example, the method described above. After identifying the locations of the unsatisfied check nodes and/or approximating the locations of the missatisfied check nodes, the controller (i) selects, in step 516, new offset values $\beta_m$ for the unsatisfied check nodes and/or missatisfied check nodes and (ii) continues, in step 518, decoding using the new offset values $\beta_m$. If the decoder converges within a specified number of iterations (decision 520), then decoding is stopped and a CRC check may be performed as described above. If the decoder does not converge within a specified number of iterations (decision 520), then further actions (step 522) may be taken to break the trapping set. For example, the controller could again select new offset values $\beta_m$ and attempt to recover the correct codeword. Various other alternative actions may be taken to break the trapping set.

Although the present invention was described relative to strengthening and weakening check-node messages by changing offset values $\beta_m$, the present invention is not so limited. Strengthening and weakening may be performed using scaling factors $\alpha_m$ rather than, or in addition to, offset values $\beta_m$. Each check-node message generated using a scaling factor $\alpha_m$ may be represented as shown in Equation (9) below:

$$R_{nm}^{(i)} = \delta_{nm}^{(i)} \alpha_m \kappa_{nm}^{(i)} \quad (9)$$

Suppose that an initial scaling factor $\alpha_m^{(0)}$ is selected. To strengthen check-node messages generated by unsatisfied check nodes, the scaling factor $\alpha_m$ may be increased and, to weaken check-node messages generated by missatisfied check nodes, the scaling factor $\alpha_m$ may be decreased. Check-node messages generated using both a scaling factor $\alpha_m$ and offset value $\beta_m$ may be represented as shown in Equation (10) below:

$$R_{nm}^{(i)} = \delta_{nm}^{(i)} \max(\alpha_m \kappa_{nm}^{(i)} - \beta_m, 0) \quad (10)$$

According to various embodiments, LDPC decoders of the present invention may apply only strengthening or only weakening rather than both strengthening and weakening. For example, according to some embodiments, the messages generated by the check nodes in the set $C_{VUSC}$ of check nodes may be weakened. Note that, in this example, the messages generated by the set $C_{USC}$ of unsatisfied check nodes are also weakened since the set $C_{USC}$ is a subset of the set $C_{VUSC}$. Further, the messages generated by the satisfied check nodes that are not in the set $C_{VUSC}$ are not weakened at all.

Although the present invention has been described relative to the specific non-layered LDPC decoder configuration 200 of FIG. 2, the present invention is not so limited. Various embodiments of the present invention may also be envisioned for other LDPC decoder structures that employ message passing. For example, the present invention may be implemented for other non-layered or for layered decoder structures, and decoders that use message-passing schedules other than a block-serial message-passing schedule. A few exemplary layered decoders are presented in U.S. patent application Ser. No. 12/113,729 filed May 1, 2008, the teachings all of which are incorporated herein by reference in their entirety.

According to various embodiments, the present invention may be implemented using check-node algorithms other than the offset min-sum algorithm. For example, such embodiments may use a scaled min-sum algorithm, or any soft-input/soft-output algorithms other than the min-sum algorithm, such as a sum-product algorithm (SPA) or the Bahl-Cocke-Jelinek-Raviv (BCJR) algorithm.

Although the present invention was described relative to the specific H-matrix 100 of FIG. 1, the present invention is not so limited. The present invention may be implemented for various H-matrices that are suitable for message-passing decoding and that are the same size as or a different size from matrix 100 of FIG. 1. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 100. Such H-matrices may be, for example, cyclic, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices. Note that the number of VNUs, barrel shifters, and/or CNUs may vary according to the characteristics of the H-matrix.

It will be further understood that various changes in the details, materials, and arrangements of the parts which have been described and illustrated in order to explain the nature of this invention may be made by those skilled in the art without departing from the scope of the invention as expressed in the following claims. For example, rather than receiving Q messages and outputting R messages using two's-complement format, CNU 300 may receive and output messages in another format such as sign-magnitude format. Also, two's-complement-to-sign-magnitude conversion may be performed by, for example, the VNUs. As yet another example, LDPC decoders of the present invention may process messages of sizes other than five bits. As even yet another example, scaling and/or offsetting may be applied at a location other than that shown for processing logic 332 of FIG. 3. For instance, scaling may be applied to the check-node messages as they are output from the CNU. As still yet another example, LDPC decoders of the present invention may be implemented without using cyclic shifters. In such embodiments, the messages may be passed between CNUs and VNUs through direct connections or using permutators that perform non-cyclic shifting.

Although embodiments of the present invention have been described in the context of LDPC codes, the present invention is not so limited. Embodiments of the present invention could be implemented for any code that can be defined by a graph, e.g., tornado codes and structured irregular repeat-accumulate (IRA) codes, since graph-defined codes suffer from trapping sets.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An apparatus comprising an error-correction decoder for recovering an error-correction-encoded codeword, the error-correction decoder comprising at least first and second check-node units, wherein, for a current iteration of the error-correction decoder:
   the first check-node unit:
      receives a first set of input values, wherein:
         the first set of input values corresponds to the error-correction-encoded codeword; and
         each input value in the first set corresponds to a different bit of the error-correction-encoded codeword; and
      generates a first check-node message based on the first set of input values and a first adjustment value; and
   the second check-node unit:
      receives a second set of input values, wherein:
         the second set of input values corresponds to the error-correction-encoded codeword; and
         each input value in the second set corresponds to a different bit of the error-correction-encoded codeword; and
      generates a second check-node message based on the second set of input values and a second adjustment value different from the first adjustment value.

2. The apparatus of claim 1, wherein, for at least one prior iteration, prior to the current iteration:
   the first check-node unit:
      receives a third set of input values, wherein:
         the third set of input values corresponds to the error-correction-encoded codeword; and
         each input value in the third set corresponds to a different bit of the error-correction-encoded codeword; and
      generates a third check-node message based on the third set of input values and a prior adjustment value; and
   the second check-node unit:
      receives a fourth set of input values, wherein:
         the fourth set of input values corresponds to the error-correction-encoded codeword; and
         each input value in the fourth set corresponds to a different bit of the error-correction-encoded codeword; and
      generates a fourth check-node message based on the fourth set of input values and the prior adjustment value.

3. The apparatus of claim 2, wherein the decoder further comprises a controller adapted to:
   determine, after the prior iteration and before the current iteration, whether the decoder has converged on the error-correction-encoded codeword; and
   replace the prior adjustment value with the first and second adjustment values, if the controller determines, after the prior iteration and before the current iteration, that the decoder has not converged on the error-correction-encoded codeword.

4. The apparatus of claim 3, wherein the controller is adapted to replace the prior adjustment value with the first and second adjustment values, if the controller determines, after the prior iteration and before the current iteration, that (i) the decoder has not converged on the error-correction-encoded codeword and (ii) the decoder has converged on a trapping set.

5. The apparatus of claim 4, wherein the controller is adapted to determine that the decoder has converged on a trapping set by:
   generating a count of a number of unsatisfied check nodes, if the decoder fails to recover the error-correction-encoded codeword after a specified number of iterations; and
   comparing the count to a specified threshold, wherein the controller determines that the decoder has converged on a trapping set when the count is less than the specified threshold.

6. The apparatus of claim 4, wherein the controller determines that the decoder has converged on a trapping set by:
   generating a variance in a number of unsatisfied check nodes over a specified number of iterations; and
   comparing the variance to a specified threshold, wherein the controller determines that the decoder has converged on a trapping set when the variance is less than the specified threshold.

7. The apparatus of claim 3, wherein, if the decoder fails to converge on the error-correction-encoded codeword, the controller:
   determines whether the first check-node unit corresponds to an unsatisfied check node; and
   selects, if the controller determines that the first check-node unit corresponds to an unsatisfied check node, the first adjustment value to increase a confidence value of the first check-node message relative to the confidence value of a check-node message that would be generated by the first check-node unit using the prior offset value.

8. The apparatus of claim 7, wherein, if the decoder fails to converge on the error-correction-encoded codeword, the controller:
   determines whether the second check-node unit corresponds to a possible missatisfied check node; and
   selects, if the controller determines that the second check-node unit corresponds to a possible missatisfied check node, the second adjustment value to decrease a confidence value of the second check-node message relative to the confidence value of a check-node message that would be generated by the second check-node unit using the prior offset value.

9. The apparatus of claim 3, wherein, if the decoder fails to converge on the error-correction-encoded codeword, the controller:
determines whether the second check-node unit corresponds to a possible missatisfied check node; and
selects, if the controller determines that the second check-node unit corresponds to a possible missatisfied check node, the second adjustment value to decrease a confidence value of the second check-node message relative to the confidence value of a check-node message that would be generated by the second check-node unit using the prior offset value.

10. The apparatus of claim 9, wherein the controller is adapted to determine a set of possible missatisfied check nodes by:
identifying a set of unsatisfied check nodes;
identifying a set of variable nodes, wherein each variable node in the set is connected to at least one of the unsatisfied check nodes in the set of unsatisfied check nodes; and
identifying the set of possible missatisfied check nodes, wherein:
each possible missatisfied check node in the set is connected to at least one variable node in the set of variable nodes; and
the set of possible missatisfied check nodes excludes unsatisfied check nodes in the set of unsatisfied check nodes.

11. The apparatus of claim 1, wherein:
the first check-node unit generates the first check-node message by applying a min-sum algorithm with a value-reuse technique to the first set of input values and the first adjustment value; and
the second check-node unit generates the second check-node message by applying the min-sum algorithm with the value-reuse technique to the second set of input values and the second adjustment value.

12. The apparatus of claim 11, wherein:
the first check-node unit comprises:
a first partial-state processor adapted to identify a smallest magnitude value and a second-smallest magnitude value for the first set of input values;
a first adjustment block adapted to apply the first adjustment value to the smallest magnitude value and the second-smallest magnitude value for the first set of input values to generate an adjusted smallest magnitude value and an adjusted second-smallest magnitude value for the first set of input values; and
a first check-node message selector adapted to generate the first check-node message based on the adjusted smallest magnitude value and the adjusted second-smallest magnitude value for the first set of input values; and
the second check-node unit comprises:
a second partial-state processor adapted to identify a smallest magnitude value and a second-smallest magnitude value for the second set of input values;
a second adjustment block adapted to apply the second adjustment value to the smallest magnitude value and the second-smallest magnitude value for the second set of input values to generate an adjusted smallest magnitude value and an adjusted second-smallest magnitude value for the second set of input values; and
a second check-node message selector adapted to generate the second check-node message based on the adjusted smallest magnitude value and the adjusted second-smallest magnitude value for the second set of input values.

13. The apparatus of claim 1, wherein the adjustment value is an offset value.

14. The apparatus of claim 1, wherein the adjustment value is a scaling factor.

15. The apparatus of claim 1, wherein the error-correction decoder is a low-density parity-check decoder and the error-correction-encoded codeword is a low-density parity-check encoded codeword.

16. A method for recovering an error-correction-encoded codeword, wherein, for a current iteration, the method comprises:
(a) receiving a first set of input values, wherein:
the first set of input values corresponds to the error-correction-encoded codeword; and
each input value in the first set corresponds to a different bit of the error-correction-encoded codeword;
(b) generating a first check-node message based on the first set of input values and a first adjustment value;
(c) receiving a second set of input values, wherein:
the second set of input values corresponds to the error-correction-encoded codeword; and
each input value in the second set corresponds to a different bit of the error-correction-encoded codeword; and
(d) generating a second check-node message based on the second set of input values and a second adjustment value different from the first adjustment value.

17. The method of claim 16, wherein, for at least one prior iteration, prior to the current iteration, the method further comprises:
(1) receiving a third set of input values, wherein:
the third set of input values corresponds to the error-correction-encoded codeword; and
each input value in the third set corresponds to a different bit of the error-correction-encoded codeword;
(2) generating a third check-node message based on the third set of input values and a prior adjustment value;
(3) receiving a fourth set of input values, wherein:
the fourth set of input values corresponds to the error-correction-encoded codeword; and
each input value in the fourth set corresponds to a different bit of the error-correction-encoded codeword; and
(4) generating a fourth check-node message based on the fourth set of input values and the prior adjustment value.

18. The method of claim 17, the method further comprises:
(5) determining, after the prior iteration and before the current iteration, whether the method has converged on the error-correction-encoded codeword; and
(6) replacing the prior adjustment value with the first and second adjustment values, if the method determines, after the prior iteration and before the current iteration, that the method has not converged on the error-correction-encoded codeword.

19. The method of claim 18, wherein, if the method fails to converge on the error-correction-encoded codeword, the method:
determines whether the third check-node message corresponds to an unsatisfied check node; and
selects, if the method determines that the third check-node message corresponds to an unsatisfied check node, the first adjustment value to increase a confidence value of the first check-node message relative to the confidence value of a check-node message that would be generated using the prior offset value.

20. The method of claim 18, wherein, if the method fails to converge on the error-correction-encoded codeword, the method:
   determines whether the fourth check-node message corresponds to a possible missatisfied check node; and
   selects, if the method determines that the fourth check-node message corresponds to a possible missatisfied check node, the second adjustment value to decrease a confidence value of the second check-node message relative to the confidence value of a check-node message that would be generated using the prior offset value.

* * * * *